US012798899B2

(12) United States Patent
Teng

(10) Patent No.: US 12,798,899 B2
(45) Date of Patent: Nov. 17, 2026

(54) SEMICONDUCTOR WAFER CONVEYOR TRANSPORT MONTRACK TRANSPORTATION SYSTEM AND METHOD

(71) Applicant: EDSN HOLDING LLC, Hsinchu County (TW)

(72) Inventor: Yu-Chen Teng, Hsinchu County (TW)

(73) Assignee: EDSN HOLDING LLC, Hsinchu County (TW)

( * ) Notice: Subject to any disclaimer, the term of this patent is extended or adjusted under 35 U.S.C. 154(b) by 166 days.

(21) Appl. No.: 18/986,804

(22) Filed: Dec. 19, 2024

(65) Prior Publication Data

US 2026/0109552 A1 Apr. 23, 2026

(30) Foreign Application Priority Data

Oct. 23, 2024 (TW) ................................ 113140260

(51) Int. Cl.
*B65G 47/90* (2006.01)
*B61B 3/02* (2006.01)
*H10P 72/30* (2026.01)

(52) U.S. Cl.
CPC ................ *B65G 47/90* (2013.01); *B61B 3/02* (2013.01); *H10P 72/3202* (2026.01); *H10P 72/3218* (2026.01); *H10P 72/3221* (2026.01); *B65G 2201/0297* (2013.01)

(58) Field of Classification Search
CPC .... E01B 25/12; B61J 1/06; B61B 3/02; B61B 13/04; B65G 47/90; B65G 2201/0297; H10P 72/3218; H10P 72/3221; H10P 72/3216
USPC ..... 414/279; 105/150; 104/118–121, 89, 91, 104/130.01, 130.09
See application file for complete search history.

(56) References Cited

U.S. PATENT DOCUMENTS 4,207,821 A * 6/1980 Beckert .................. B60L 13/00 104/106
4,416,202 A * 11/1983 Rooklyn ................ B61F 11/00 104/247

(Continued)

FOREIGN PATENT DOCUMENTS

TW I638760 B 10/2018

*Primary Examiner* — Gregory W Adams
(74) *Attorney, Agent, or Firm* — MUNCY, GEISSLER, OLDS & LOWE, P.C.

(57) ABSTRACT

Provided are a semiconductor wafer conveyor transport and a monotrack transportation system and method. The system includes a support frame, carrier gripping mechanism, monotrack vehicle, monotrack rotating turntable, track, and monotrack horizontal transfer device. The system integrates with a gripper-based transfer structure (L-type) to facilitate movement of carriers between the monotrack and the conveyor system using a load port transfer mechanism. The gripper moves bi-directionally to pick up the carriers from the monotrack vehicle and transfer them to the conveyor load port or vice versa. The gripper grabs both sides of the carrier's box, lifts the carrier via the inner lifting mechanism, and transfers the carrier from the loading position to the unloading position, or vice versa, within the transfer structure. The outer lifting mechanism lowers the carrier onto the monotrack vehicle, which transports it to a stocker or internal transfer system, rendering the carrier movement seamless and efficient.

9 Claims, 17 Drawing Sheets

(56) References Cited

U.S. PATENT DOCUMENTS

| | | | | |
|---|---|---|---|---|
| 4,770,589 | A * | 9/1988 | Bryan | B65G 67/603<br>104/165 |
| 8,753,061 | B2 * | 6/2014 | Tseng | H10P 72/3402<br>414/940 |
| 9,659,802 | B2 * | 5/2017 | Wang | H10P 72/3221 |
| 2022/0406639 | A1 * | 12/2022 | Hsiao | H05F 3/00 |

* cited by examiner

SEMICONDUCTOR WAFER CONVEYOR TRANSPORT MONTRACK TRANSPORTATION SYSTEM AND METHOD

BACKGROUND OF THE INVENTION

1. Field of the Invention

The invention pertains to a semiconductor wafer conveyor transport and a monotrack transportation system and method, essentially comprising a support frame, a gripping mechanism, a monotrack vehicle body, a monotrack rotating turntable, a track, and a monotrack horizontal transfer device. The monotrack transportation structure is integrated with a gripper transport structure, enabling the transfer of wafer carriers onto the monotrack transport vehicle. With a combination of the monotrack rotating turntable and the monotrack horizontal transfer device, the system transports the wafer carriers to an upright wafer carrier storage unit or a secondary transfer mechanism.

2. Description of Related Art

Please refer to Taiwan patent number 1638760, entitled "Wafer Transport Carrier and Wafer Cassette Detection Method." This involves a wafer transport carrier, which includes: a carrying device, a suspension device, and a detection device. The detection device is disposed on the carrying device and configured to detect the position of a door panel of the wafer cassette. The wafer cassette detection method includes: suspending a wafer cassette from semiconductor equipment using a suspension device and moving it into a receiving space of the carrying device, with the suspension device positioned within the receiving space. The structure of the wafer cassette carrier and detection method involves vertical movement for transporting the wafer cassette. This represents the development trend of the wafer cassette structure and transport method but does not apply the operation of a gripping mechanism.

SUMMARY OF THE INVENTION

The primary objective of this invention is to propose a semiconductor wafer conveyor system and a monotrack transportation system and method. The invention focuses on a system that integrates a monotrack transport structure with a gripping transfer mechanism. The transfer area includes a wafer carrier gripping mechanism and a monotrack vehicle for placing the wafer carriers. The method for the wafer carrier gripping mechanism involves loading the wafer carriers onto a transport track structure, which runs to a transfer area located beneath the gripping mechanism. The gripping mechanism, which has an H-shaped structure, is equipped with opposing grippers at its left and right ends, waiting to grip the wafer carrier. The method works by the gripper's grabbing the side handler of the wafer carriers, lifting the carrier via a lifting mechanism, moving it outward for a short distance, lowering the wafer carrier onto the monotrack vehicle, and transporting the carrier to storage equipment (stocker) for wafer carriers.

The monotrack vehicle includes an upper payload sensor, a front truck at the front, and a rear truck at the back. The upper section serves as the payload sensor, while a concave embedded space is formed between the front and rear trucks, providing the space for the vehicle to travel on the monotrack. The monotrack vehicle is combined with a turntable to perform rotation, and the monotrack vehicle also integrates with a horizontal transfer device to perform horizontal transfer movements.

DETAILED DESCRIPTION OF THE INVENTION

Figure 1:
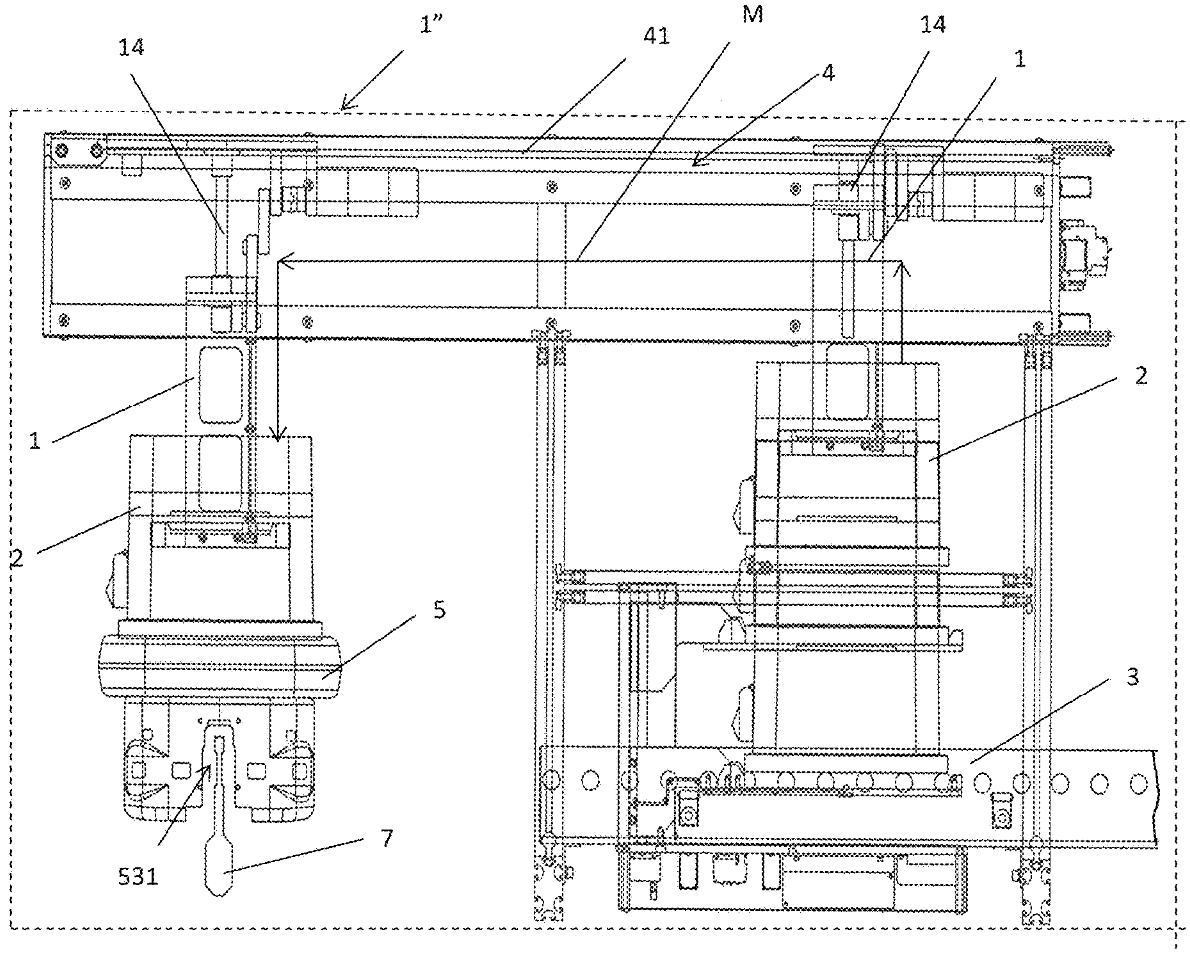
FIG. 1 is an integration view of a gripping mechanism and a monotrack vehicle of the invention.
Figure 2:
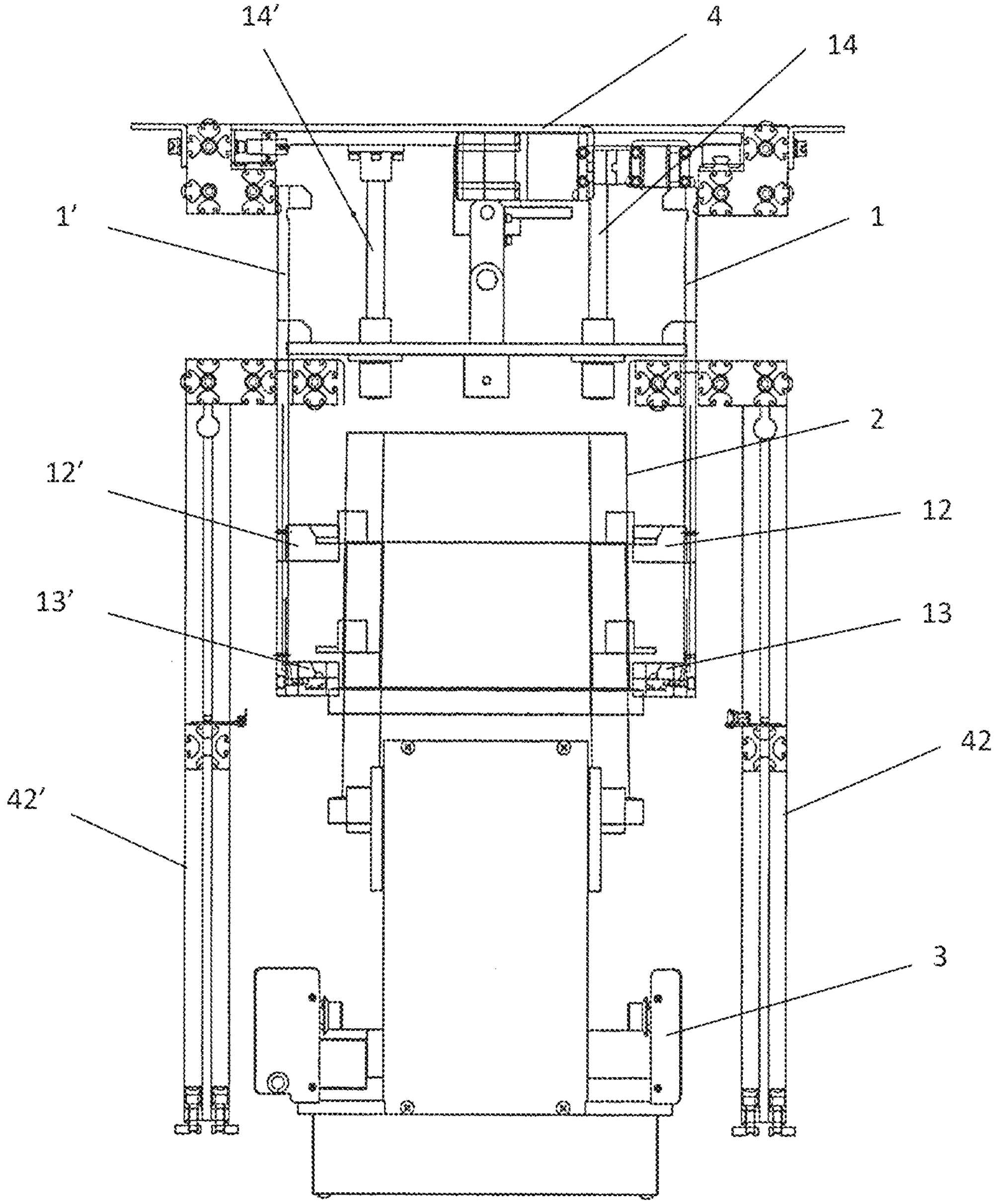
FIG. 2 is a left side view of the gripping mechanism of the invention
Figure 3:
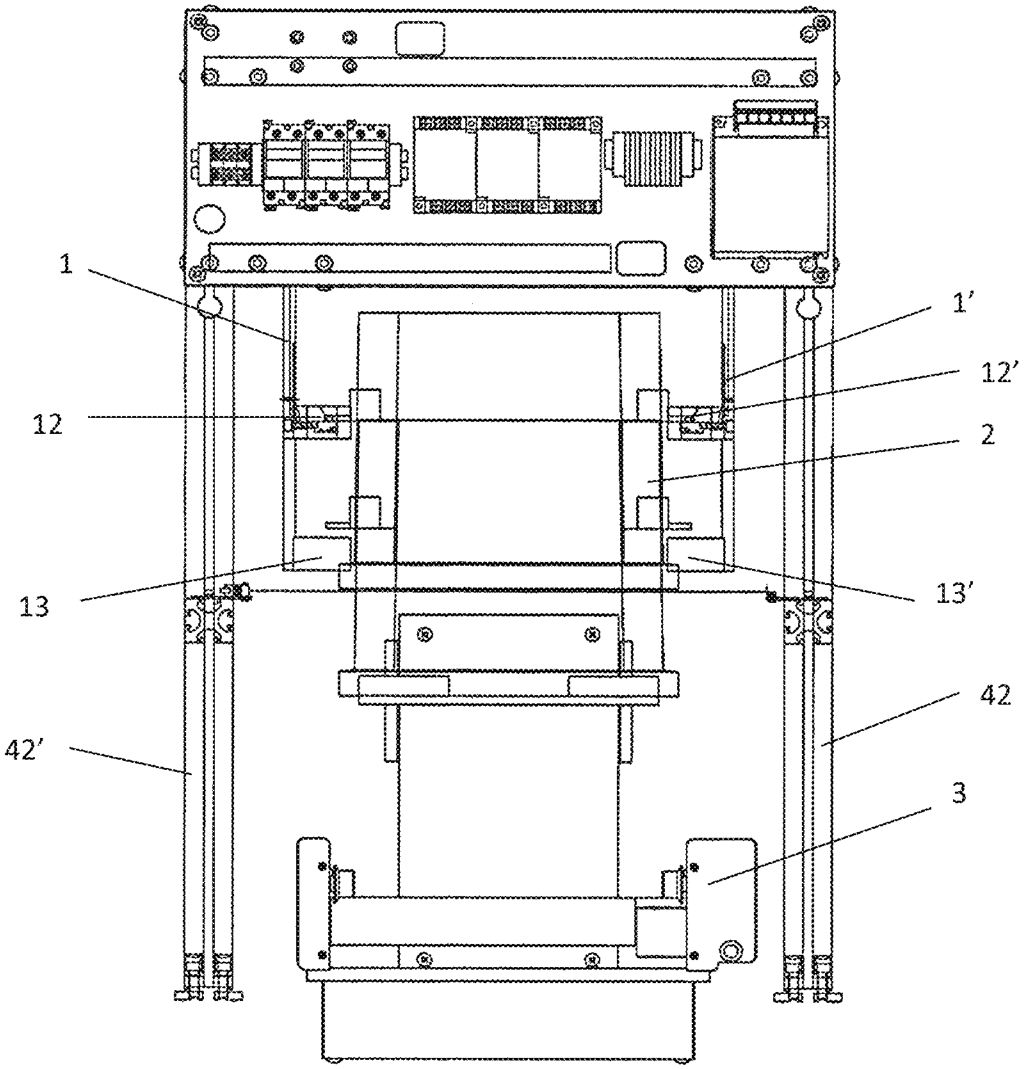
FIG. 3 is a right side view of the gripping mechanism of the invention.
Figure 4:
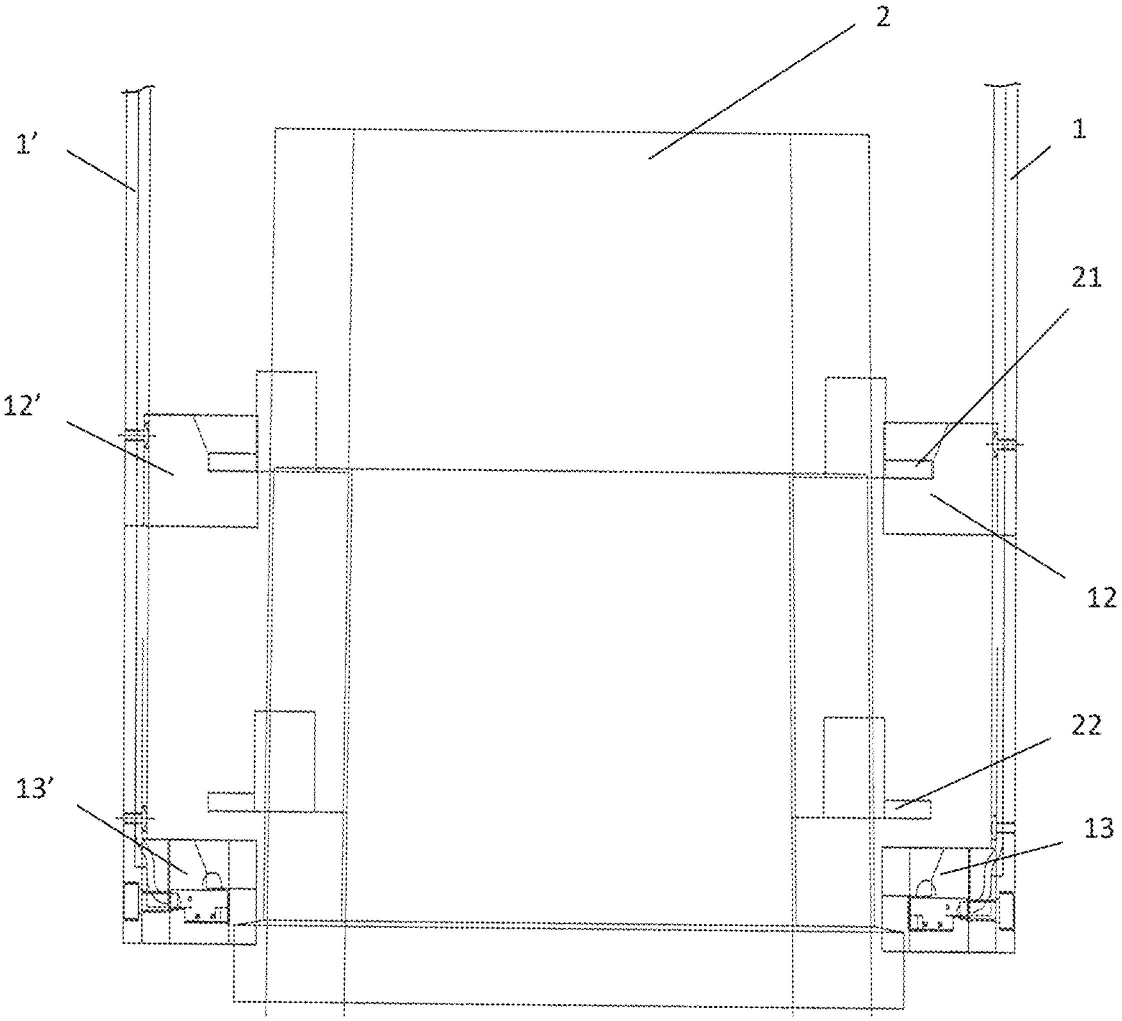
FIG. 4 is a loaded view of the gripping mechanism and carriers of the invention.
Figure 5:
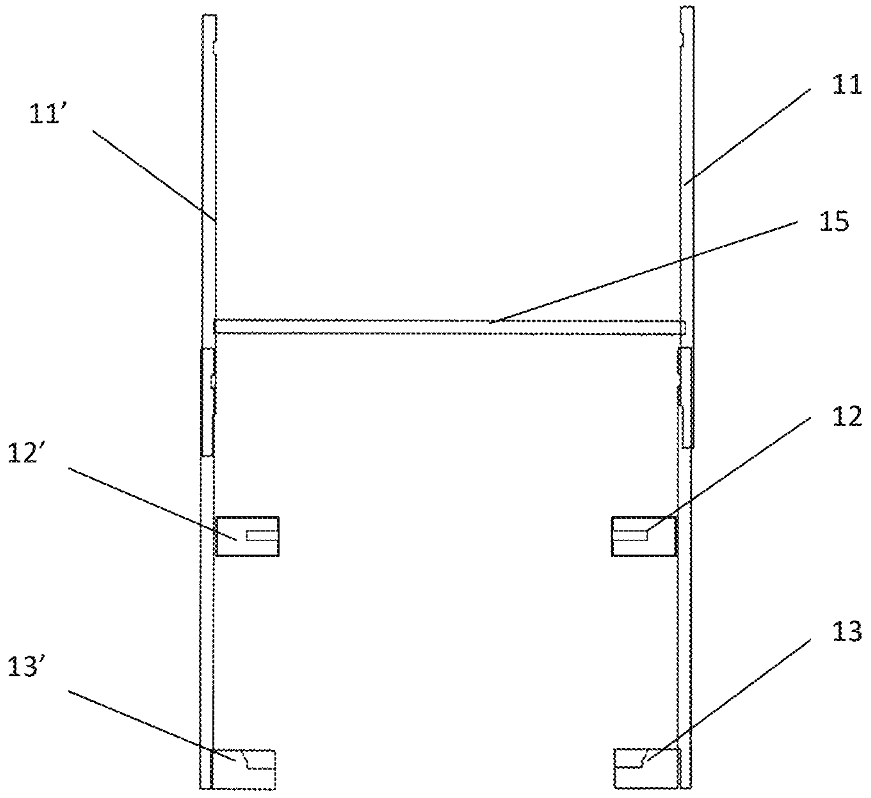
FIG. 5 is a front view of gripping mechanism of the invention.
Figure 6:
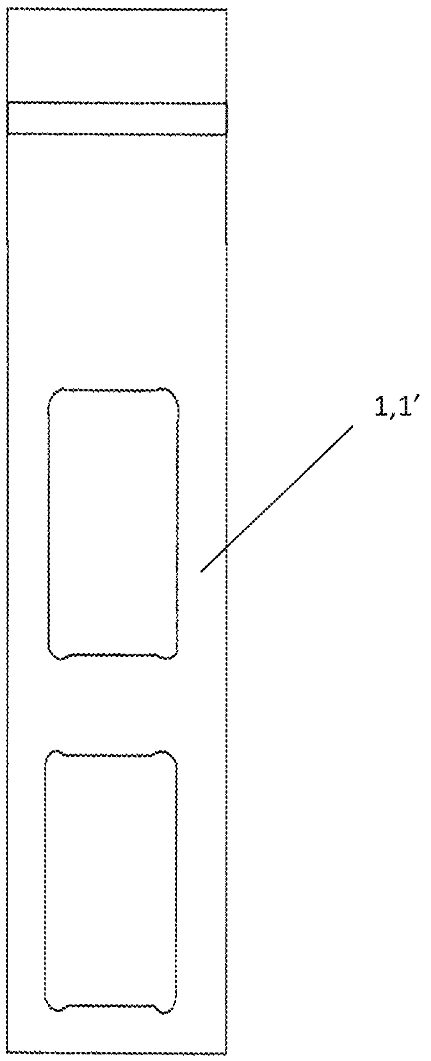
FIG. 6 is a side view of the gripping mechanism of the invention.
Figure 7:
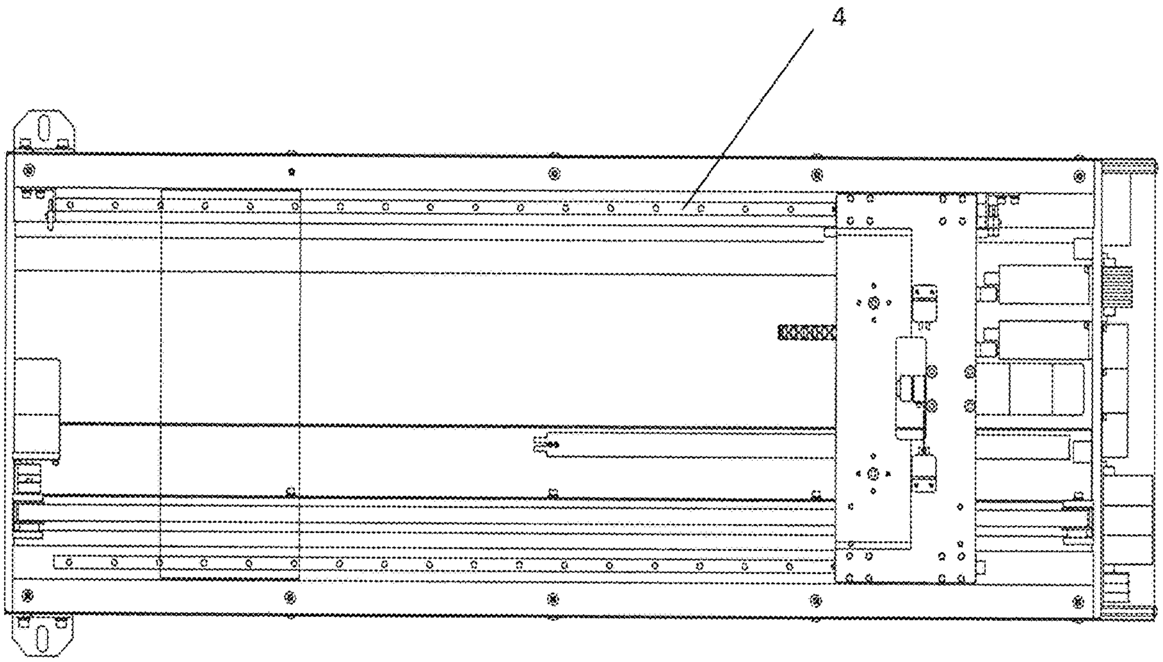
FIG. 7 is a top view of the gripping mechanism of the invention.

Referring to FIGS. 1 to 7, the main system comprises a support frame 4, a gripping mechanism 1, a monotrack vehicle 5, a monotrack turntable 6, mono tracks 7, and a monotrack horizontal transfer device 8. The gripping mechanism 1 is disposed above the transfer area 1" and suspended on both sides of the support frame 4 with support columns 42, 42'. The gripping mechanism 1 comprises connecting rods 14,14', gripper arms 11, 11', upper clamps 12, 12', and lower clamps 13, 13'. The upper part of the gripper arms 11, 11' is connected to the connecting rods 14, 14', and the upper clamps 12, 12' and lower clamps 13, 13' are disposed on the inner sides of the gripper arms 11, 11' along with reinforcement rods 15.

Figure 8:
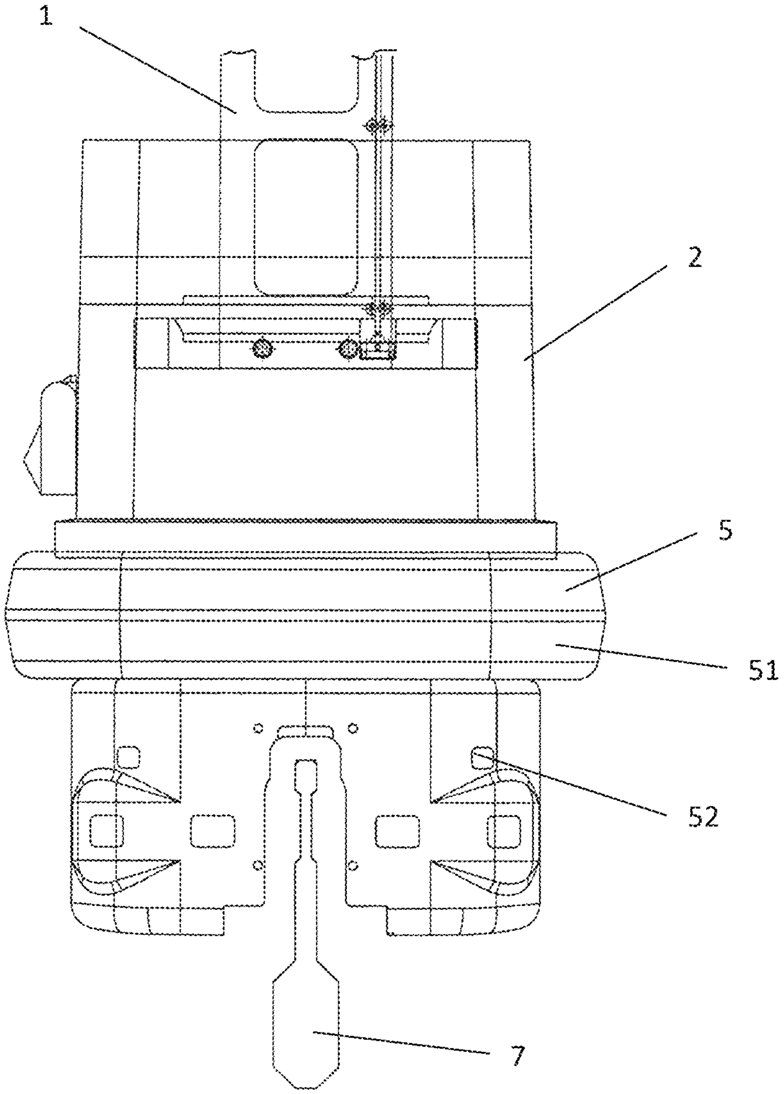
FIG. 8 is a portion of a schematic view of the monotrack vehicle integrate with gripping mechanism of the invention.
Figure 9:
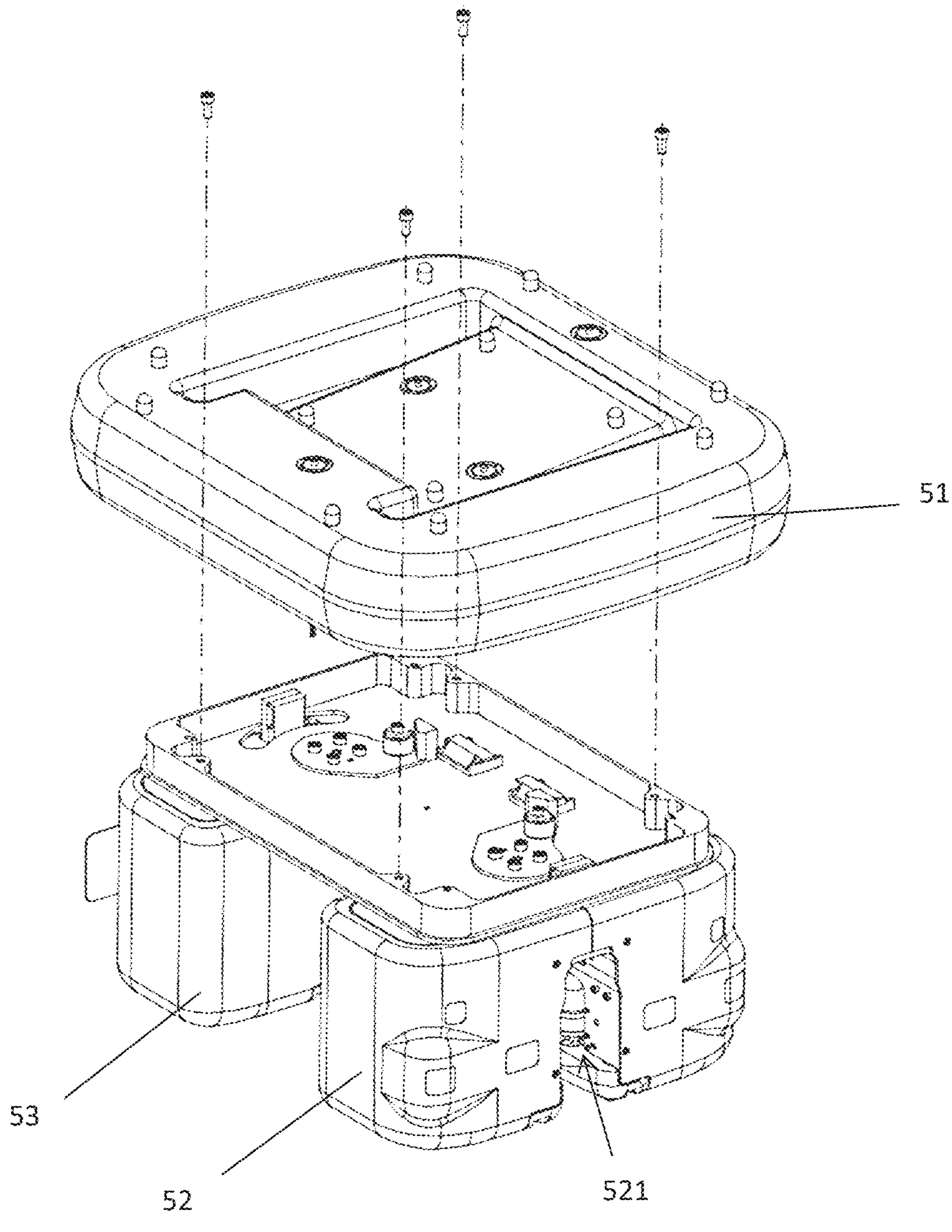
FIG. 9 is an exploded view of the monotrack vehicle of the invention.
Figure 10:
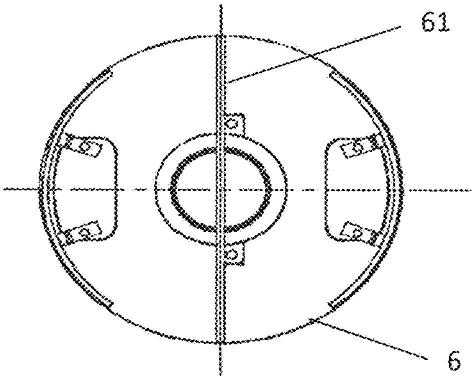
FIG. 10 is a top view of the monotrack vehicle and a monotrack turntable of the invention.
Figure 11:
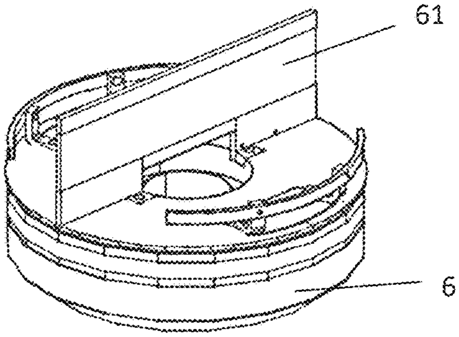
FIG. 11 is a perspective view of the monotrack vehicle and the monotrack turntable of the invention.
Figure 12:
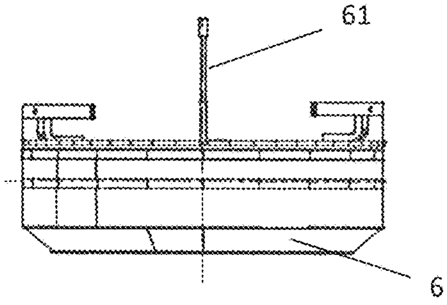
FIG. 12 is a side view of the monotrack vehicle and the monotrack turntable of the invention.
Figure 13:
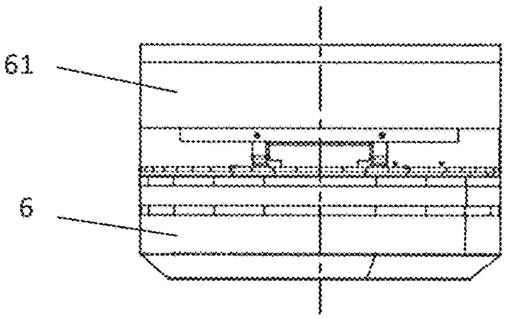
FIG. 13 is a front view of the monotrack vehicle and the monotrack turntable of the invention.
Figure 14:
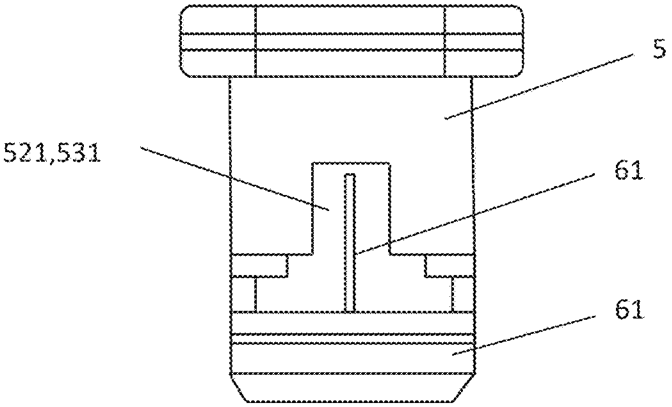
FIG. 14 is a schematic view of the monotrack vehicle and the monotrack turntable connected together according to the invention.
Figure 21:
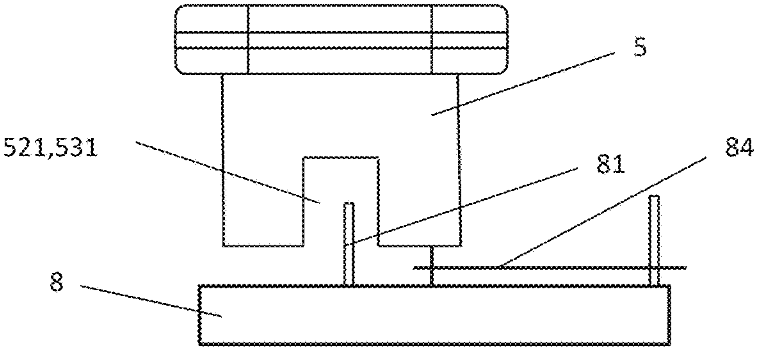
FIG. 21 is a longitudinal sectional connection view of the monotrack vehicle on the monotrack horizontal transfer device of the invention.

As shown in FIGS. 8 and 9, the monotrack vehicle 5 is overall U-shaped and comprises a payload sensor 51, a front truck 52, and a rear truck 53. The payload sensor 51, which is square-shaped, is disposed on top, with the front truck 52 disposed at the lower front end and the rear truck 53 at the lower rear end. Between the front truck 52 and the rear truck 53, there is a concave embedded space 521, 531, with the front truck 52 featuring a central concave embedded space 521 and the rear truck 53 featuring a central concave embedded space 531, as shown in FIG. 8. As illustrated in FIG. 14, the monotrack vehicle 5 combines with the monotrack turntable 6, enabling the vehicle to perform rotational movement. As shown in FIG. 21, the monotrack vehicle 5 is also combined with the horizontal transfer device 8, allowing it to perform horizontal transfer operations.

As shown in FIGS. 10 to 14, the monotrack vehicle 5 of this invention is combined with the monotrack turntable 6. The front truck 52 and rear truck 53 of the monotrack vehicle 5, as depicted in FIG. 14, feature embedded spaces 521, 531, which are engaged by the track 61 disposed on the monotrack turntable 6, enabling rotational operation. The monotrack turntable 6 is circular and features a central track 61.

Figure 15:
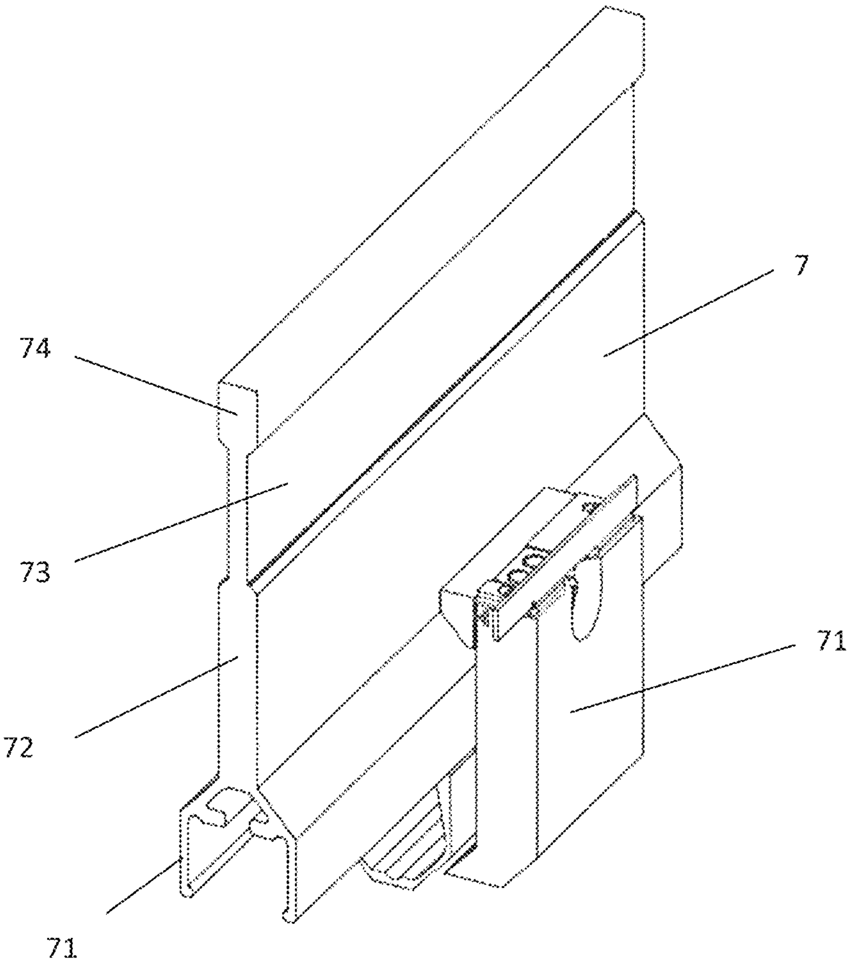
FIG. 15 is a perspective view of a track and a charger connected together according to the invention.
Figure 16:
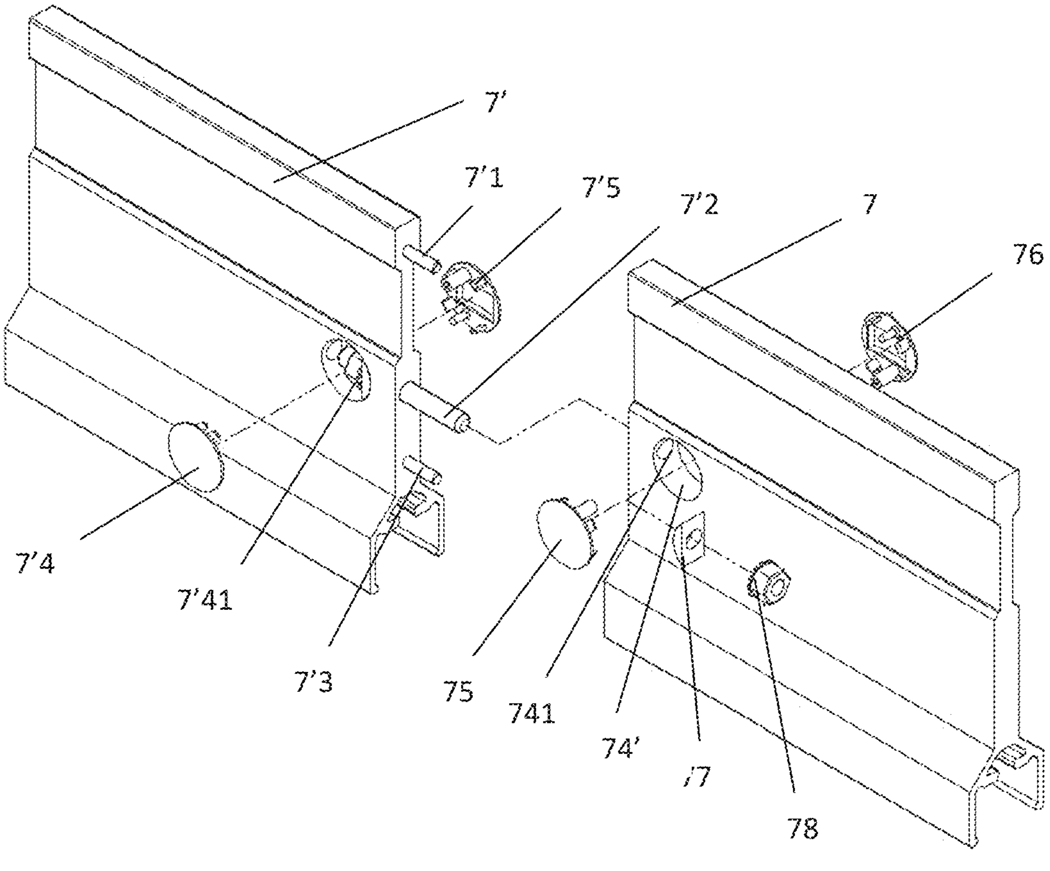
FIG. 16 is a perspective view of the monotrack and monotrack connection of the invention.
Figure 17:
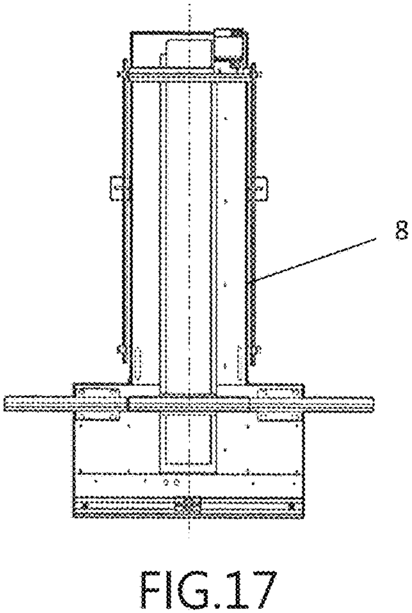
FIG. 17 is a top view of the monotrack vehicle on a monotrack horizontal transfer device of the invention.
Figure 18:
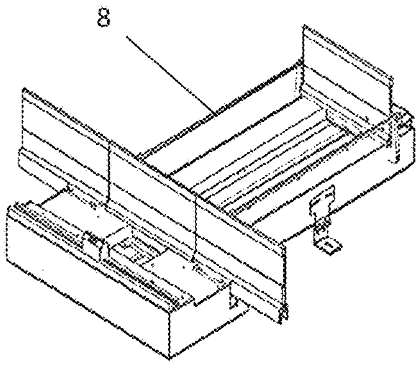
FIG. 18 is a perspective view of the monotrack vehicle on the monotrack horizontal transfer device of the invention.
Figure 19:
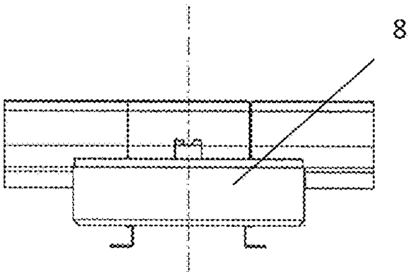
FIG. 19 is a front view of the monotrack vehicle on the monotrack horizontal transfer device of the invention.
Figure 20:
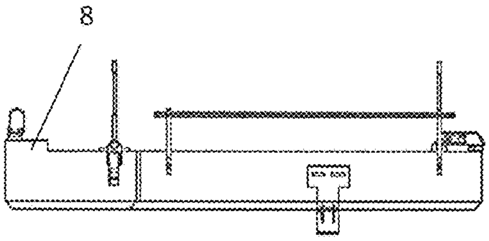
FIG. 20 is a side view of the monotrack vehicle on the monotrack horizontal transfer device of the invention.

As shown in FIGS. 15 and 16, the track 7 and the connection state between track 7 and track 7' are illustrated. The track 7 has an inverted T-shaped lower end, with an inverted U-shaped body 71 connected to the upper first end panel 72, second end panel 73, and a square-shaped top end panel 74. A charger S is disposed on the left side of the track, and perforations 74 and through-hole 741 are disposed on one side of the top panel, allowing for the connection with the through-rod 7'2 of track 7'. The connection between track 7 and track 7' is secured using spacers 77 and screws 78, assembled with nuts 75, 76. Another through-rod 7'1 is disposed on the upper part, 7'3 on the lower part, forming a connection between the ends of track 7 and track 7'.

Figure 22:
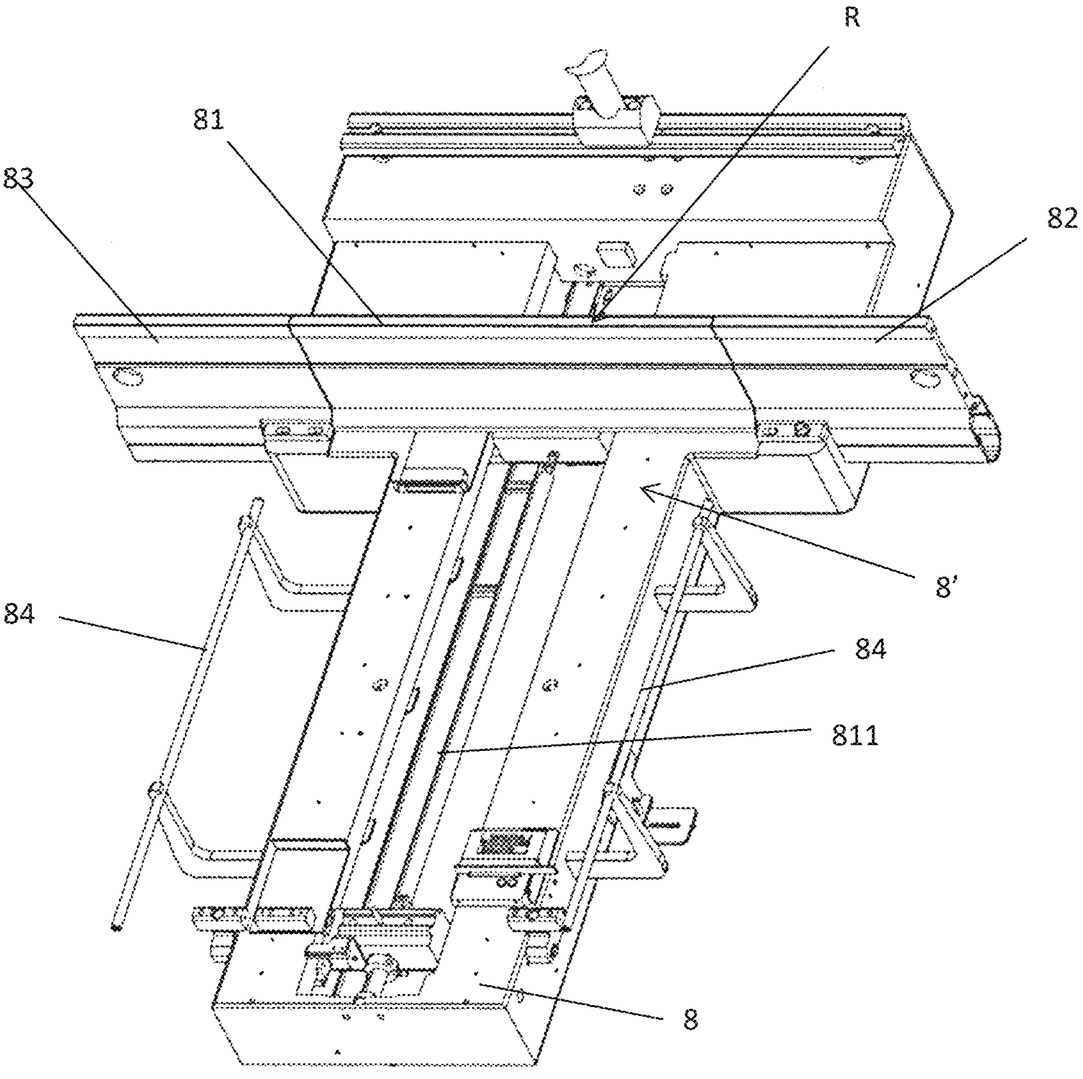
FIG. 22 is another perspective view of the monotrack vehicle on the monotrack horizontal transfer device of the invention.
Figure 23:
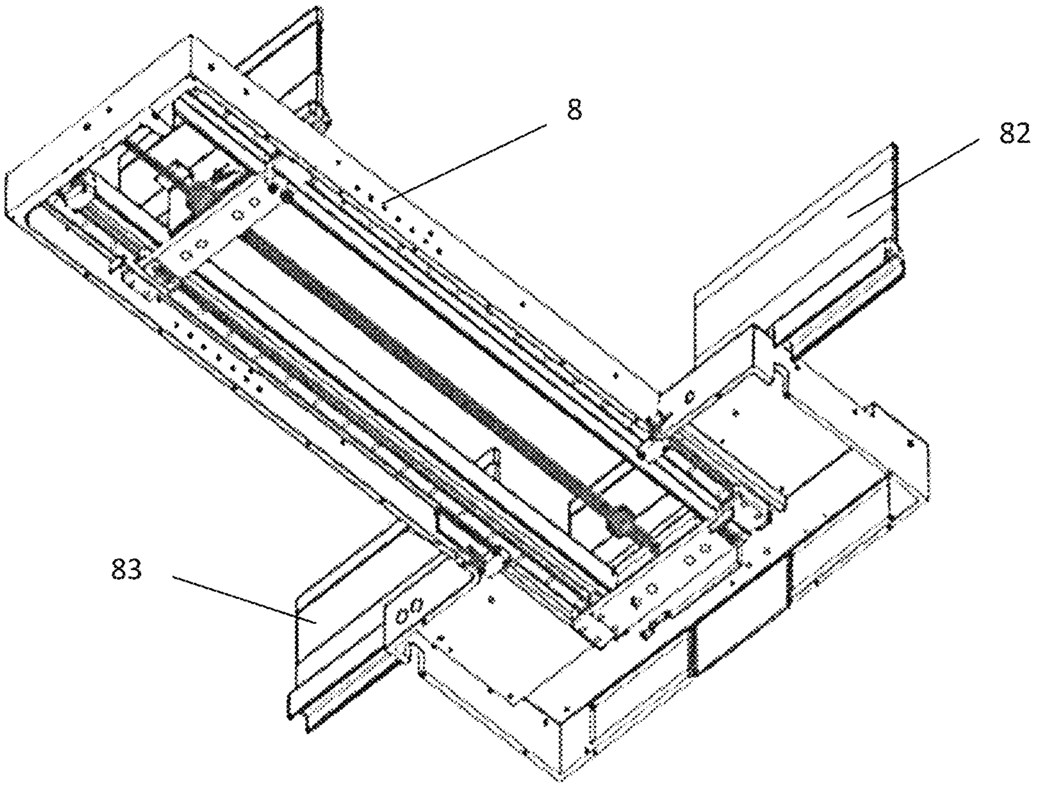
FIG. 23 is a bottom view of the monotrack vehicle on the monotrack horizontal transfer device of the invention.
Figure 24:
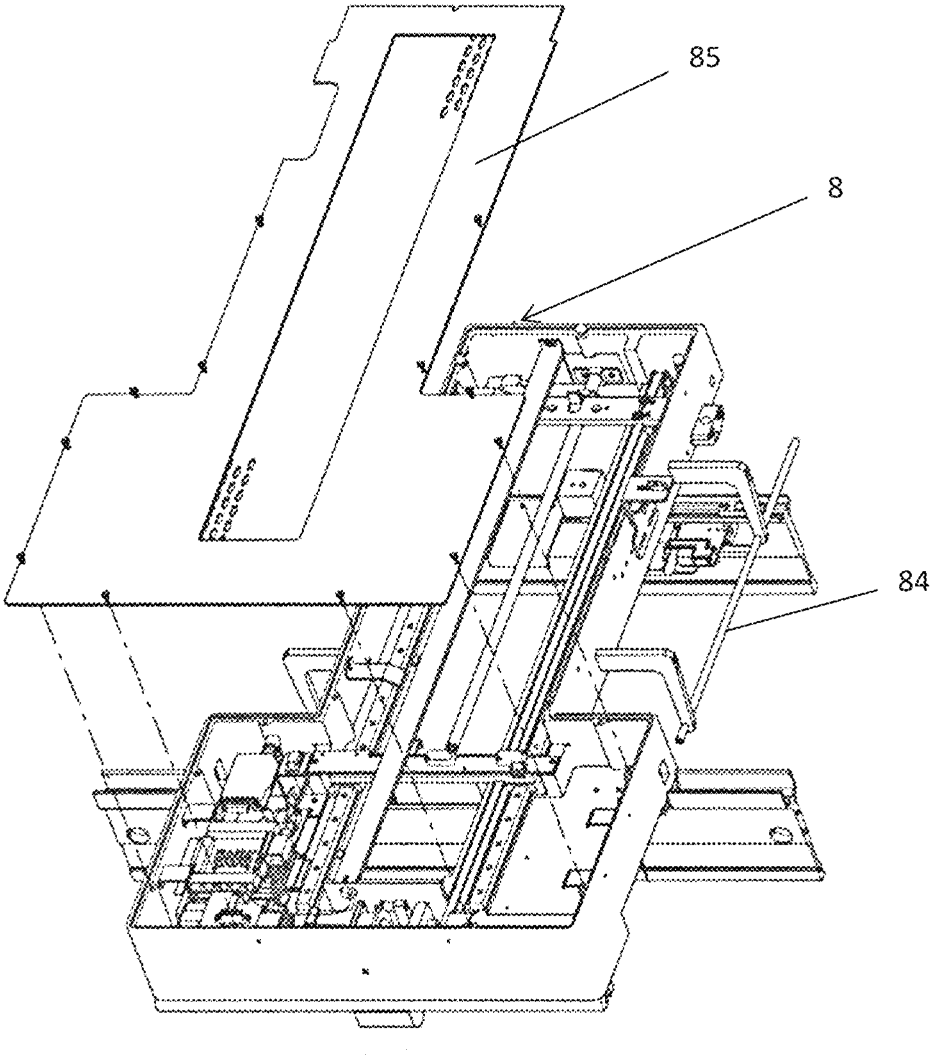
FIG. 24 is a perspective covered view of the monotrack vehicle on the monotrack horizontal transfer device of the invention.
Figure 25:
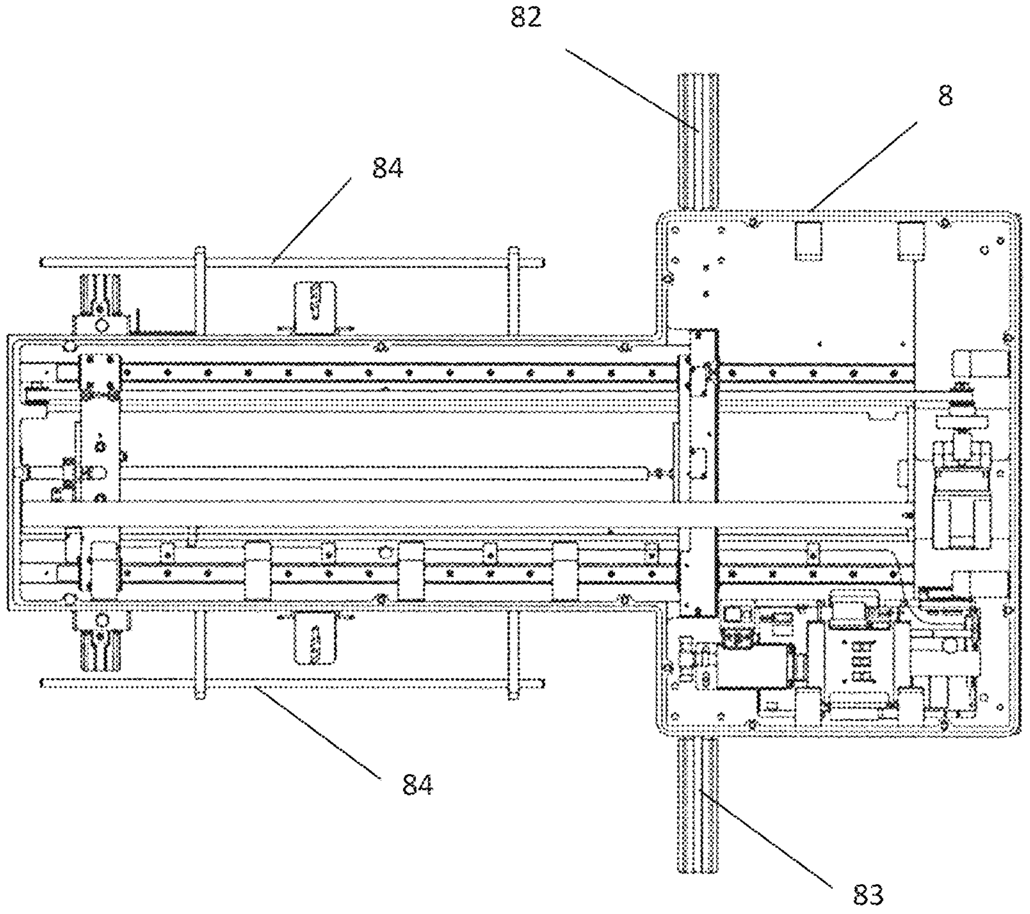
FIG. 25 is a bottom view of another monotrack vehicle on the monotrack horizontal transfer device of the invention.

As shown in FIGS. 17 to 25, the monotrack horizontal transfer device 8 is T-shaped, with the main body 8' featuring a track R, pull rods 811, and handrails 84. As shown in FIG. 22, the T-shaped main body 8' is equipped with a right track 82, left track 83, and a transfer track 81 disposed at the front end. The transfer track 81, located at the center, is capable of parallel movement, with the right track 82 and left track 83 disposed on both sides. The rear end features handrails 84. The transfer track 81 operates along the pull rods 811 to perform horizontal transfer, as shown in FIG. 21, where the monotrack vehicle 5 is combined with the monotrack horizontal transfer device 8. The embedded spaces 521, 531 of the monotrack vehicle 5 engage with the track R of the monotrack horizontal transfer device 8, and horizontal transfer operations are performed via the transfer track 81 using pull rods 811, with a cover plate 85 used to seal the bottom.

As shown in FIG. 1, the transfer area 1" includes the gripping mechanism 1 for wafer carriers 2 and the monotrack vehicle 5 for placing the wafer carriers 2. The invention provides a method for the gripping mechanism 1 to handle wafer carriers 2 in the transfer area 1". The gripping mechanism 1 is suspended below the transfer rod 41 by connecting rods 14. When the wafer carriers 2 move along the transport track structure 3 and arrive below the gripping mechanism 1 in the transfer area 1", the gripping mechanism 1, using its upper clamp 12 and lower clamp 13, grips the ears 21, 22 on both sides of the wafer carriers 2. In the inner side of the transfer area 1", the wafer carriers 2 are lifted by a lifting mechanism to a certain height, then transported outward by the transfer rod 41 for a short distance. The wafer carriers 2 are lowered onto the monotrack vehicle 5 using the lifting mechanism and then transported to the vertical wafer carrier storage system.

Therefore, the gripping mechanism 1 handles the wafer carriers 2 within the transfer area 1", performing internal and external transfer operations. The wafer carriers 2 are placed on the monotrack vehicle 5 for transportation to the vertical wafer carrier storage system or secondary transport systems. This invention provides an integrated wafer carrier transfer conveyor system and monotrack transportation method.

While the invention has been described in terms of preferred embodiments, those skilled in the art will recognize that the invention can be practiced with modifications within the spirit and scope of the appended claims.

What is claimed is:

1. A semiconductor wafer conveyor transport and a monotrack transportation system, comprising:

a support frame;

a gripping mechanism disposed in a transfer area, suspended on two sides of the support frame with support columns, and comprising a connecting rod, a gripping arm, and an upper and lower clamp head, with the connecting rod connected to a top of the gripping arm, wherein the upper and lower clamp heads are disposed on an inner side of the gripping arm;

a mono track;

a mono-track vehicle being inverted concave shape, comprising an effective load sensor, front trunk, and rear trunk, and configured to wirelessly move along the mono track;

a mono-track turntable circular in shape with the mono track disposed at a center of the mono-track turntable; and a mono-track horizontal transfer device being T-shaped and comprising a T-shaped body, a track disposed on a top, a pull rod, and a handrail fence, with right and left tracks disposed on two sides and being parallel in a horizontal dimension, a transfer track disposed at a front end, and a handrail fence at a rear end, wherein the support columns are disposed above the transfer area and equipped with a transfer rod, wherein the track is T-shaped with an inverted U-shaped lower end for wire way, connected to the first end panel, second end panel, and a square end panel at the top, with a charger disposed on the left side, wherein the gripper mechanism in the transfer area is suspended on the support columns to grasp a wafer box, perform transfer operations between the inner and outer areas of the transfer zone, and place the wafer box on the mono-track vehicle, which moves along the mono track containing the mono-track turntable and horizontal transfer device and is applicable to wafer transportation and logistic.

2. The semiconductor wafer conveyor transport and the monotrack transportation system of claim 1, wherein the mono-track vehicle has an effective load sensor disposed at the top of payload area, contains a front trunk and a rear trunk combine with the payload body, forming a concave hollow structure between the front and rear trunks to fit mono-track vehicles moving along the mono track.

3. The semiconductor wafer conveyor transport and the monotrack transportation system of claim 1, wherein the mono-track vehicle has a concave space at centers of the front trunk and rear trunk, providing ability to balance and move along either mono track, mono-track turntable or mono track horizontal transfer device.

4. The semiconductor wafer conveyor transport and the monotrack transportation system of claim 1, wherein the mono track horizontal transfer device has a perforation disposed at a center of a left side of the track, and a side of the perforation has a transverse hole adapted to combine with a cross rod from another track, secured with spacers and screws, and assembled with nuts on both sides.

5. The semiconductor wafer conveyor transport and the monotrack transportation system of claim 1, wherein the mono track system has a perforation disposed at a center of the right side of another track, and a side of the perforation has a cross rod, with a cross rod disposed above and another below, with three cross rods and one end of the track assembled and connected to another track with nuts.

6. A semiconductor wafer conveyor transport and a monotrack transportation method, wherein a carrier on a conveyor load port system in a transfer area is equipped with a gripping mechanism zone for a wafer carrier and a monotrack body area for placing the wafer carrier, wherein a gripping mechanism is suspended on the transfer rod through a connecting rod, with the wafer carrier moving on the mono-track vehicle, wherein the gripping mechanism clamps the wafer carrier's side handler with the upper and lower clamp heads disposed on the gripping arm after reaching the transfer area below the gripping mechanism, followed by the wafer carrier being lifted to a certain height via the elevating mechanism of the inner-side lifting mechanism in the transfer area and transfers it outward along the transfer rod, followed by the wafer carrier being lowered onto the mono-track vehicle by the lowering mechanism, and then the wafer carrier being transported to stocker or secondary interface transfer system.

7. The semiconductor wafer conveyor transport and a monotrack transportation method of claim 6, wherein the horizontal transfer track in the transfer area is not only centrally positioned to move in a parallel direction but is also parallel to the pull rod such that the mono-track vehicle can be transported in a direction parallel to the pull rod to provide redundances on the mono track system, and other vehicles can still go through the other parallel mono tracks along the side while the wafer carrier on the vehicle is being transferred.

8. The semiconductor wafer conveyor transport and a monotrack transportation method of claim 6, wherein the mono-track vehicle and mono-track turntable combine to perform a rotational movement in a circular direction, enhancing transportation efficiency.

9. The semiconductor wafer conveyor transport and a monotrack transportation method of claim 6, wherein the mono-track vehicle and the mono-track horizontal transfer device combine to perform a horizontal transfer movement, and provide a redundance mono track among the other track to enhance transportation efficiency.

* * * * *